(12) United States Patent
Ikeda et al.

(10) Patent No.: US 7,728,222 B2
(45) Date of Patent: Jun. 1, 2010

(54) DYE-SENSITIZED PHOTOELECTRIC CONVERSION DEVICE

(75) Inventors: Masaaki Ikeda, Tokyo (JP); Koichiro Shigaki, Tokyo (JP); Teruhisa Inoue, Tokyo (JP)

(73) Assignee: Nippon Kayaku Kabushiki Kaisha, Tokyo (JP)

( * ) Notice: Subject to any disclaimer, the term of this patent is extended or adjusted under 35 U.S.C. 154(b) by 892 days.

(21) Appl. No.: 10/469,670

(22) PCT Filed: Mar. 5, 2002

(86) PCT No.: PCT/JP02/02024

§ 371 (c)(1),
(2), (4) Date: Sep. 2, 2003

(87) PCT Pub. No.: WO02/071530

PCT Pub. Date: Sep. 12, 2002

(65) Prior Publication Data

US 2004/0074532 A1 Apr. 22, 2004

(30) Foreign Application Priority Data

Mar. 7, 2001 (JP) ............................. 2001-062727
Jul. 12, 2001 (JP) ............................. 2001-212715

(51) Int. Cl.
*H01L 31/042* (2006.01)
*H01M 14/00* (2006.01)

(52) U.S. Cl. ................ 136/263; 136/250; 136/256; 257/40; 257/431; 429/111

(58) Field of Classification Search ............... 136/243, 136/263, 250, 256; 257/40, 431
See application file for complete search history.

(56) References Cited

U.S. PATENT DOCUMENTS

| 2,803,640 | A | * | 8/1957 | Heckert ................ 558/335 |
| 4,927,721 | A | | 5/1990 | Gratzel et al. ............. 429/111 |
| 5,084,365 | A | | 1/1992 | Gratzel et al. ............. 429/111 |
| 5,670,091 | A | * | 9/1997 | Marder et al. ............. 252/582 |
| 6,084,176 | A | | 7/2000 | Shiratsuchi et al. ......... 136/263 |
| 6,376,765 | B1 | * | 4/2002 | Wariishi et al. ........... 136/263 |
| 7,141,735 | B2 | | 11/2006 | Ikeda et al. .............. 136/263 |
| 2002/0010969 | A1 | | 1/2002 | Goettel et al. ............. 8/405 |
| 2003/0152827 | A1 | | 8/2003 | Ikeda et al. .............. 429/111 |
| 2004/0074532 | A1 | | 4/2004 | Ikeda et al. .............. 136/250 |
| 2004/0099306 | A1 | | 5/2004 | Hara et al. ............... 136/263 |
| 2004/0187918 | A1 | | 9/2004 | Ikeda et al. .............. 136/263 |
| 2006/0130249 | A1 | | 6/2006 | Ikeda et al. .............. 8/550 |

FOREIGN PATENT DOCUMENTS

| CN | 1861740 | 11/2006 |
| EP | 0 566 077 | 10/1993 |
| EP | 0 566 081 | 10/1993 |
| EP | 0 566 082 | 10/1993 |
| EP | 0 892 411 | 1/1999 |
| EP | 0 924 724 | 6/1999 |
| EP | 1 075 005 | 2/2001 |
| EP | 1 311 001 | 5/2003 |
| JP | 48-3115 | 1/1973 |
| JP | 2664194 | 6/1997 |
| JP | 11-158395 | 6/1999 |
| JP | 11-163378 | 6/1999 |
| JP | 11-176489 | 7/1999 |
| JP | 11-214731 | 8/1999 |
| JP | 2000-26487 | 1/2000 |
| JP | 2000-195569 | 7/2000 |
| JP | 2000-223167 | 8/2000 |
| JP | 2000-268892 | 9/2000 |
| JP | 2000-285977 | 10/2000 |
| JP | 2000-285978 | 10/2000 |
| JP | 2001-042524 | 2/2001 |
| JP | 2001-064529 | 3/2001 |
| JP | 2002-164089 | 6/2002 |
| JP | 2003-059547 | 2/2003 |
| JP | 2005-227376 | 8/2005 |
| WO | 02/11213 | 2/2002 |
| WO | 2004/082061 | 9/2004 |

OTHER PUBLICATIONS

The European Search Report dated Feb. 13, 2006.
The Supplemental European Search Report dated Feb. 21, 2007.
The International Search Report dated Sep. 17, 2002.
J.Am.Chem.Soc. 1993, 115, 6382-6390; "Conversion of Lights to Electricity by cis-X2Bis (2,2'bipyridyl-4, 4'-dicarboxylate) ruthenium (II) Charge-Transfer Sensitizers (X=Cl-BR-,1-CN-, and SCN-) on Nanocrystalline TiO2 Electrodes"; M.K. Nazeeruddin, et al.
Nature, vol. 353 Oct. 24, 1991; "A low-cost, high-efficiency solar cell based on dye-sensitized colloidal TiO2 films"; Brian O'Regan et al.
Office actions from co-pending U.S. Appl. No. 10/482,425; dated Feb. 25, 2009,Sep. 17, 2008,Feb. 21, 2008, and Aug. 22, 2007.
The International Search Report dated May 25, 2004.
Office Action from co-pending U.S. Appl. No. 10/482,425 dated Jul. 7, 2009.
Shirota, Yasuhiko; "Organic materials for electronic and optoelectronic devices", J.Mater. Chem., 2000, 10, pp. 1-25.
Office Action dated Sep. 17, 2009 in co-pending U.S. Appl. No. 10/548,858.
Chemistry Letters 1998; pp. 1241-1242; Wataru Kubo et al.; "Fabrication of Quasi-solid-state Dye-sensitized Ti(2 Solar Cells Using Low Molecular Weight Gelators".
J.Am.Chem. Soc. 2006, 128, p. 16701-16707; Shanghoon Kim et al.; "Molecular Engineering of Organic Sensitizers for Solar Cell Applications".
The International Search Report dated May 22, 2007.
Tanaka et al., JP2001-064529 A online machine translation.
OA dated Jan. 19, 2010in co-pending U.S. Appl. No. 10/482,425.

* cited by examiner

*Primary Examiner*—Basia Ridley
*Assistant Examiner*—Thanh-Truc Trinh
(74) *Attorney, Agent, or Firm*—Nields, Lemack & Frame, LLC

(57) ABSTRACT

A photoelectric conversion device comprising an organic dye-sensitizing semiconductor fine particle thin film is prepared by using a dye having a barbituric acid structure as a partial structure and by adsorbing the dye on a semiconductor thin film electrode, and thereby a low-cost photoelectric conversion device having high conversion efficiency, and a solar cell using the device are provided.

10 Claims, No Drawings

DYE-SENSITIZED PHOTOELECTRIC CONVERSION DEVICE

TECHNICAL FIELD

The present invention relates to photoelectric conversion devices sensitized with organic compound(s) and solar cells, and particularly, to photoelectric conversion devices characterized by using oxide semiconductor fine particles. sensitized with a compounds having specific structure, specifically a dye, and a solar cell utilizing the same.

BACKGROUND OF THE INVENTION

A solar cell utilizing sunlight as an alternative energy source to a fossil fuel such as petroleum, coal or the like has been in the spotlight. Today, developments and studies are being conducted on enhancement of efficiency and the like of a silicon solar cell which uses crystalline or amorphous silicon, a compound semiconductor solar cell which uses gallium, arsenic or the like. However, since much energy is required for producing these solar cells and the cost of them is high, there is a problem that it is difficult to put them to general use. Further, a photoelectric conversion device which uses semiconductor fine particles sensitized with dye(s) and a solar cell which uses this device have been known whereupon materials for use in producing them and techniques for producing them have been disclosed. (B. O'Regan and M. Gratzel Nature, 353, 737 (1991), M. K. Nazeeruddin, A. Kay, I. Rodicio, R. Humphry-Baker, E. Muller, P. Liska, N. Vlachopoulos, M. Gratzel, J. Am. Chem. Soc., 115, 6382 (1993) e.t.c.). This photoelectric conversion device is produced by using a comparatively low-cost oxide semiconductor such as titanium oxide or the like. Since there is a possibility that a photoelectric conversion device can be obtained in low cost compared with a solar cell which uses a conventional silicon or the like, this device has been remarked. However, in order to obtain a device having high conversion efficiency, a ruthenium-type complex is used as a sensitizing-dye wherein the dye itself is high in cost and there also is a problem in supply thereof. Further, although it has already been attempted to use an organic dye as a sensitizing-dye, it is a present situation that, due to low conversion efficiency and the like, it has not yet been used practically.

By this reason, a development of a photoelectric conversion device, using an organic dye-sensitized semiconductor, which has high conversion efficiency as well as high practicability has been required.

DISCLOSURE OF THE INVENTION

The present inventors have made an extensive effort to solve the above-described problems and, as a result, have found that a photoelectric conversion device having high conversion efficiency can be obtained by sensitizing semiconductor fine particles with a dye having a specific barbituric acid part and, then, producing a photoelectric conversion device to achieve the present invention.

Namely, the present invention relates to 1. a photoelectric conversion device, characterized by comprising oxide semiconductor fine particles sensitized with a compound having the following partial structure (1)

(1)

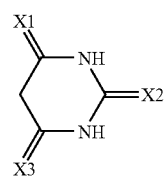

(wherein X1, X2 and X3 each independently is oxygen atom or sulfur atom, selenium atom);

2. the photoelectric conversion device according to the above 1, wherein the compound having a partial structure (1) is a compound comprising the partial structure (1) and a hydrocarbon residue of 3-40 carbons (which may be substituted and which may contain nitrogen atom or oxygen atom in the structure), the hydrocarbon residue is bonded to the partial structure (1) by an unsaturated double bond at the 5-position (a carbon atom between the carbon atoms where X1 and X2 are substituted) of the partial structure (1) and there is an unsaturated double bond between a carbon which is next to the bonded atom and a carbon next thereto;

3. the photoelectric conversion device according to the above 1, wherein the compound having the partial structure (1) is a compound represented by the following formula (2)

(2)

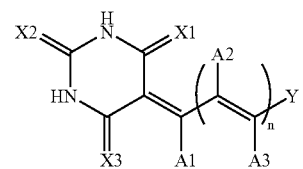

{wherein A1, A2 and A3 each independently is an optionally substituted aromatic hydrocarbon residue, an optionally substituted amino group, hydroxyl group, hydrogen atom, halogen atom, cyano group or an optionally substituted aliphatic hydrocarbon residue; X1, X2 and X3 each independently is oxygen atom or sulfur atom, selenium atom; Y is an optionally substituted aromatic hydrocarbon residue excluding a structure represented by salicylic acid and dihydroxybenzene derivative, an optionally substituted organometallic complex residue or an optionally substituted amino group; n is an integer of 0-5; when n is 2 or more whereby a plurality of A2 and A3 are present, each of A2 and each of A3 may be same or different and each shows the above-mentioned groups; and A1, A2 (including the case where a plurality thereof are present) and A3 (including the case where a plurality thereof are present) may form a ring being bonded by a plurality of groups therein and the ring formed as such may be substituted};

4. the photoelectric conversion device according to the above 1, wherein the compound having the partial structure (1) is a compound represented by the following formula (3)

(3)

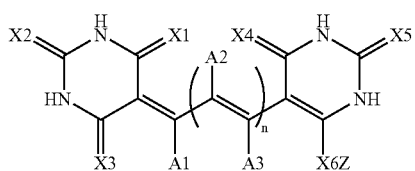

{wherein A1, A2 and A3 each independently is an optionally substituted aromatic hydrocarbon residue, an optionally substituted amino group, hydroxyl group, hydrogen atom, halogen atom, cyano group or an optionally substituted aliphatic hydrocarbon residue; X1 to X6 each independently is oxygen atom or sulfur atom, selenium atom; Z is hydrogen atom or metal atom or may form an onium salt by making a pair with X6; n is an integer of 0-5; when n is 2 or more whereby a plurality of A2 and A3 are present, each of A2 and each of A3 may be same or different and each shows the above-mentioned group; and A1, A2 (including the case where it is present in plural) and A3 (including the case where it is present in plural) may form a ring being bonded by a plurality of groups therein and the ring formed as such may be substituted};

5. the photoelectric conversion device according to any of the above 1 to 4, wherein all of X1-X6 in the partial structure (1) and the formulae (2) and (3) are oxygen atoms;

6. the photoelectric conversion device according to the above 3 or 5, wherein Y of the formula (2) is an aromatic hydrocarbon residue having a substituted amino group;

7. a photoelectric conversion device which is characterized in using an oxide semiconductor sensitized by the joint use of two or more members selected from the compound having the partial structure (1) mentioned in the above 1 and organic dye (including metal complex) having no partial structure 1 (excluding the case of joint use of organic dye(s) (including metal complexes) having no partial structure 1);

8. the photoelectric conversion device according to the above 7, wherein the compound having a partial structure (1) is the compound of the formula (2) mentioned in the above 3 or the compound of the formula (3) mentioned in the above 4;

9. the photoelectric conversion device according to any of the above 1-8, wherein the fine particles of the oxide semiconductor contain titanium dioxide as an essential component;

10. the photoelectric conversion device according to any of the above 1-9, wherein dye(s) is adsorbed to the fine particles of oxide semiconductor in the presence of an inclusion compound;

11. a solar cell which is characterized in using the photoelectric conversion device mentioned in any of the above 1-9;

12. fine particles of oxide semiconductor which is sensitized by a compound having the partial structure (1) mentioned in the above 1; and 13. the fine particles of oxide semiconductor according to the above 12, wherein the compound having the partial structure (1) is a compound of the formula (2) mentioned in the above 3 or a compound of the formula (3) mentioned in the above 4.

BEST MODE FOR CARRYING OUT THE INVENTION

The present invention will now be described in detail as hereunder.

With regard to the compound having the above partial structure (1), there may be exemplified a compound comprising the partial structure (1) and a hydrocarbon residue of 3-40 carbons (which may be substituted or nitrogen atom or oxygen atom may be contained in the structure), the hydrocarbon residue is bonded to the partial structure (1) by an unsaturated double bond at the 5-position (a carbon atom between the carbon atoms where X1 and X2 are substituted) of the partial structure (1) and there is an unsaturated double bond between a carbon which is next to the bonded atom and a carbon next thereto.

With regard to the compound comprising the above partial structure (1) and the above hydrocarbon residue of 3-40 carbons, a dye(s) compound is usually preferred. With regard to the dye(s) compound having the partial structure (1), a dye(s) compound of a methine type, etc. may be exemplified and a dye(s) compound of a methine type is preferred. In the case of a dye(s) compound of a methine type, the compound having the partial structure (1) comprises the partial structure(1) and the methine dye(s) residue comprising the above hydrocarbon of 3-40 carbons.

With regard to the representative compounds of the preferred methine type dye(s) compound used in the present invention, there may be exemplified the compounds represented by the above formulae (2) and (3).

In the formula (2), A1, A2 and A3 each independently is an optionally substituted aromatic hydrocarbon residue, an optionally substituted amino group, hydroxyl group, hydrogen atom, cyano group , halogen atom, or an optionally substituted aliphatic hydrocarbon residue and, when there are a plurality of A2 and A3, each of them independently is the above group as well.

The above aromatic hydrocarbon residue means a group where one hydrogen atom is removed from an aromatic hydrocarbon and, with regard to the aromatic hydrocarbon, there may be exemplified benzene, naphthalene, anthracene, phenanthrene, pyrene, indene, azulene, fluorene and perylene. Usually, they are aromatic hydrocarbons having aromatic ring (aromatic ring and fused ring containing aromatic ring) of 6-16 carbons and, with regard to the above aromatic hydrocarbon residue in the present invention, a residue where one hydrogen atom is removed from such an aromatic hydrocarbon is preferred. More preferred one is phenyl group. With regard to a substituent on the aromatic hydrocarbon residue in case the aromatic hydrocarbon residue is substituted, that will be mentioned later.

With regard to the above aliphatic hydrocarbon residue, there may be exemplified residues where one hydrogen atom is removed from saturated and unsaturated and straight-chain, branched-chain and cyclic aliphatic hydrocarbons. Although there is no particular limitation for carbon numbers, there maybe usually exemplified 1 to about 36 carbon(s) and, preferred one is a straight-chain alkyl group having 1 to about 20carbon(s). Most common one is an alkyl group having 1 to about 6 carbon(s). With regard to a cyclic one, there may be exemplified cycloalkyl having 3 to 8 carbons.

Although there is no particular limitation with regard to a substituent on the hydrocarbon residue having 3-40 carbons bonding to the above partial structure (1) and a substituent on the aromatic hydrocarbon residue or the aliphatic hydrocarbon residue in A1, A2 and A3, there may be exemplified an optionally substituted alkyl group (in the case of the aromatic hydrocarbon residue), an aryl group, cyano group, isocyano group, thiocyanato group, isothiocyanato group, nitro group, nitrosyl group, halogen atom, hydroxyl group, sulfo group, phosphoric acid group, an esterified phosphoric acid group (hereinafter, it will be referred to as a phosphate group), a substituted or unsubstituted mercapto group, a substituted or unsubstituted amino group, a substituted or unsubstituted amide group, an alkoxyl or a substituted carbonyl group such as an alkoxycarbonyl group, carboxyl group, carbonamide group and an acyl group. With regard to the above optionally substituted alkyl group, there may be usually exemplified an optionally substituted one having 1 to about 36 carbon(s) and, preferably, an alkyl group having 1 to about 20 carbon(s) may be exemplified. Most common one is an alkyl group having 1 to about 6 carbon(s). The alkyl group may be further substituted with a substituent except the above alkyl group.

With regard to the acyl group in the above substituent, etc., there may be exemplified a $C_{1-10}$ alkylcarbonyl group, arylcarbonyl group, etc. and, preferably, there may be exemplified a $C_{1-4}$ alkylcarbonyl group or, to more specific, acetyl group and propionyl group.

With regard to the specific examples of the substituent other than the above acyl group, the following ones may be exemplified.

With regard to the halogen atom, there may be exemplified an atom such as fluorine, chlorine, bromine and iodine and preferred ones are chlorine, bromine and iodine.

With regard to the phosphate group, there may )e exemplified an alkyl phosphate group having 1 to 4 carbon(s).

With regard to the substituted or unsubstituted mercapto group, there may be exemplified mercapto group and an alkylmercapto group and, preferably, an alkylmercapto group having 1 to 4 carbon(s) may be exemplified.

With regard to the substituted or unsubstituted amino group, there may be exemplified amino group; a mono- or dialkylamino group which may be substituted (examples of the substituent on the alkyl group are phenyl group, an alkoxyl group, halogen atom, hydroxyl group, cyano group and an alkoxycarbonyloxy group),such as mono- or dimethylamino group, mono- or diethylamino group and mono- or dipropylamino group, benzylamino group and an alkoxyalkylamino group; an aryl-substituted amino group such as an optionally substituted mono- or diphenylamino group (examples of a substituent on the phenyl group are an alkyl group, etc.) and mono- or dinaphthylamino group; and an alkylarylamino group such as N-($C_{1-4}$ alkyl- oralkoxy-substitutedpheny) -N-alkylamino group.

With regard to the substituted or unsubstitute damidegroup, there may be exemplified amide group, an alkylamide group and an aromatic amide group.

With regard to the alkyl group in those substituents, there may be exemplified an alkyl group having 1 to 20 carbon(s), preferably 1 to 10 carbon(s) and, more preferably; 1 to 4 carbon(s).

With regard to the alkoxyl group, there may be exemplified an alkoxyl group having 1 to 10 carbon(s). The alkoxy group may be further substituted with an alkoxy group, halogen atom, an aryl group, etc.

With regard to the alkoxycarbonyl group, there may be exemplified an alkoxycarbonyl group having 1 to 10 carbon(s).

An acid group such as carboxyl group, sulfo group and phosphate group and hydroxyl group may form a salt and, with regard to the salt, there may be exemplified a salt with alkaline metal or alkaline earthmetal such as lithium, sodium, potassium, magnesium and calcium and a salt , such as a quaternary ammonium salt, with organic base, such as, for example , tetramethylammonium, tetrabutylammonium, pyridinium and imidazolium.

With regard to the preferred A1, A2 and A3, there may be exemplified hydrogen atom, halogen atom, an optionally substituted alkyl group, hydroxyl group, a dialkylamino group and an optionally substituted phenyl group (examples of the substituent are hydroxyl group and an alkylamino group) and more preferred ones are hydrogen atom or an optionally substituted alkyl group.

Plurality of A1 and A2 (including the case where a plurality thereof are present) and A3 (including the case where a plurality thereof are present) may be bonded to form a ring and the ring formed as such may be substituted. Examples of the formed ring are an unsaturated hydrocarbon ring and a heterocycle. With regard to the unsaturated hydrocarbon ring, there may be exemplified benzene ring, naphthalene ring, anthracene ring, phenanthrene ring, pyrene ring, indene ring, azulene ring, fluorene ring, cyclobutene ring, cyclohexene ring, cyclopentene ring, cyclohexadiene ring and cyclopentadiene ring while, with regard to the heterocycle, there may be exemplified pyridine ring, pyrazine ring, piperidine ring, indoline ring, thiophene ring, furan ring, pyran ring, oxazole ring, thiazole ring, indole ring, benzothiazole ring, benzoxazole ring, quinoline ring, carbazole ring and benzopyran ring. Among those, preferred examples are cyclobutene ring, cyclopentene ring, cyclohexene ring and pyran ring. It is also possible to have a substituent such as carbonyl group and thiocarbonyl group and, in that case, a cyclic ketone or a cyclic thioketone may be formed.

Incidentally, with regard to the substituent in the group mentioned as "optionally substituted" in the present invention, there may be exemplified those which are listed in the passages referring to the substituents, etc. on the above hydrocarbon residue of 3-40 carbons except those which are especially described.

Y is an optionally substituted aromatic hydrocarbon residue except that is the structure represented by salicylic acid and dihydroxybenzene derivative, an optionally substituted organometallic complex residue or an optionally substituted amino group.

As the aromatic hydrocarbon residue and substituent thereof in Y, the same ones as those mentioned in the above explanation for A1, A2 and A3 may be exemplified. It is also possible that the substituents on the aromatic hydrocarbon ring in Y are bonded together to form a heterocycle structure such as a julolidine ring (such as specific examples 39, 79 and 80), a quinoline ring (such as specific example 83, etc.) and a carbazole ring (such as specific examples 33, 34 and 82).

With regard to the optionally substituted amino group in Y, the same one which is mentioned in the above passages for A1, A2 and A3 may be exemplified as well. Thus, there may be exemplified a diaryl-substituted amino group such as diphenylamino group, monophenylamino group, a dialkylamino group, amonoalkylamino group, amonoalkylmonoaryl-substituted amino group such as an alkylphenylamino group, an acylamino group such as benzoylamino group and acetylamino group, analkoxy amino, a monoalkylene-substituted amino group, a dialkylene-substituted amino group and an unsubstituted amino group. An alkyl group or an aryl group such as phenyl group on the amino group may be further substituted. With regard to the substituent on the alkyl group or the aryl group, there may be exemplified the same ones which are mentioned as the substituents on the aromatic hydrocarbon residue or aliphatic hydrocarbon residue in the above passages for A1, A2 and A3.

With regard to the preferred optionally substituted amino group in Y, there may be exemplified mono- or di-substituted amino group which is substituted with at least one alkyl group or phenyl group (which may be substituted with an alkoxy group, etc.) such as mono- or diphenylamino group, alkoxy-substituted monophenylmonoalkylamino group and monoalkoxyphenyl monoalkylamino group. More preferred groups are mono- or diphenylamino group and monoalkyl-mono(optionally substituted with alkoxy) phenylamino group. Herein, as the alkyl group, an alkyl group having 1 to about 20 carbon(s) is preferred and more preferred one is an alkyl group having 1 to 6 carbons. The substituent on the alkyl group of the optionally substituted mono- or dialkylamino group is an aryl group, halogen atom and an alkoxyl group etc.

With regard to the organometallic complex residue in Y, there may be exemplified ferrocene, ruthenocene, titanocene, zirconocene, phthalocyanine, porphyrin and ruthenium bipyridyl complex.

The preferable group as Y, includes mono- or di-substituted aminophenyl group where amino group is substituted with an alkyl group or phenyl group such as diphenylaminophenyl group, monophenylaminophenyl group, dialkylaminophenyl group and monoalkylaminophenyl group; mono- or di-substituted aminonaphthalene group; and mono- or di-substituted amino group where amino group is substituted with an alkyl group or phenyl group (in the case of a dialkylamino group, the alkyl groups may be bonded together to form a ring), for example, diphenylamino group, monophenylamino group, dialkylamino group, monoalkylamino group and piperidino group. More preferred Y is a mono- or di-substituted aminophenyl group where the amino group is substituted with an alkyl group or phenyl group or a mono- or di-substituted amino group where one of hydrogen atoms of the amino group is substituted with phenyl group while another hydrogen atom is unsubstituted or substituted with an alkyl group or phenyl group.

The preferable compounds as the compound of the formula (2) are those where X1, X2 and X3 are oxygen atom, sulfur atom or selenium atom; n is zero or 1 to 2; A1, A2 and A3 each independently is hydrogen atom, a ($C_1$ to $C_4$) alkyl group, phenyl group which may be substituted with hydroxyl group, mono- or di($C_1$ to $C_4$) alkylamino group, etc., a mono- or di($C_1$ to $C_4$) alkylamino group or halogen atom; and Y is mono- or di-substitute-daminophenyl group {the benzene ring may further have one or more substituent(s) selected from a group consisting of a ($C_1$ to $C_4$) alkyl group, hydroxyl group and a ($C_1$ to $C_4$) alkoxyl group and, with regard to the substituent on the amino group, there may be exemplified unsubstituted ($C_1$ to $C_{20}$, preferably, $C_1$ to $C_4$) alkyl group; $C_1$ to $C_4$ alkyl group having at least one member selected from a group consisting of carboxyl group, hydroxyl group, halogen atom, ($C_1$ to $C_4$) alkoxyl group and phenyl group; and phenyl group}, phenyl group having a substituent selected from a group consisting of hydroxyl group, ($C_1$ to $C_4$) alkoxyl group and morpholino group, mono- or di-substituted amino group {with regard to the substituent on the amino group, there may be exemplified unsubstituted ($C_1$ to $C_4$) alkyl group or phenyl group}, naphthyl group which is substituted with one or more member(s) selected from a group consisting of amino group, ($C_1$ to $C_4$) alkylamino group, hydroxyl group and carboxyl group, anthranyl group substituted with ($C_1$ to $C_4$) alkylamino group and ferrocene or ruthenocene which is an organic metallic complex residue.

More preferred compound of the formula (2) is that where X1, X2 and X3 are oxygen atoms; n is zero or 1 to 2; A1, A2 and A3 are hydrogen atoms; and Y is mono- or di-substituted aminophenyl group {with regard to the substituent on the amino group, there may be exemplified unsubstituted ($C_1$ to $C_4$, more preferably, $C_2$ to $C_4$) alkyl group or phenyl group} or mono- or di-substituted amino group {with regard to the substituent on the amino group, there may be exemplified unsubstituted ($C_1$ to $C_4$, more preferably, $C_2$ to $C_4$) alkyl group and phenyl group and, in the case of di-substituted substance, both may be bonded to form a ring}.

Those compounds may be in a form of structural isomers such as cis- and trans-form although there is no particular limitation therefor but any of them will do.

A1, A2 and A3 and n in the formula (3) are as same as those in the formula (2). X1-X6 therein are also as same as X1-X3 in the formula (2). Z is hydrogen atom, metal atom or z may form an onium salt making a pair with X6. With regard to the metal atom, there may be exemplified alkaline metal or alkaline earth metal such as lithium, sodium, potassium, magnesium and calcium and, when an onium salt is formed making a pair with X6, there may be exemplified salts such as quaternary ammonium salt of tetramethylammonium, tetrabutylammonium, pyridinium, imidazolinium, etc.

The compound of the formula (2) may be prepared, for example, by condensation of a barbituric acid compound of the formula (1) corresponding to the aimed compound and a methine carbonyl derivative (4) (aniline derivative, etc.) represented by the formula (4) corresponding to the aimed compound in an organic solvent at room temperature to refluxing temperature.

The compound of the formula (3) is prepared by the reaction of 1 mole. of a dianiline derivative of the formula (5) with 2 moles of the barbituric acid compound of the formula (1) in the similar manner.

With regard to the organic solvent, there may be exemplified an alcohol such as methanol, ethanol and propanol; aprotic polar solvent such as N,N-dimethylformamide and N-methylpyrrolidone; acetic acid; and acetic anhydride. When a base is used as the catalyst, the aimed product may be obtained in a good yield. With regard to the basic catalyst, representative examples thereof are caustic soda, sodium methylate, sodium acetate, triethylamine, piperazine and diazabicycloundecene.

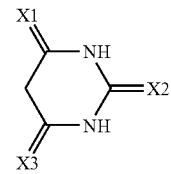

(1)

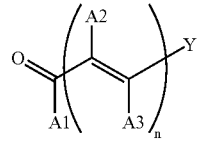

(4)

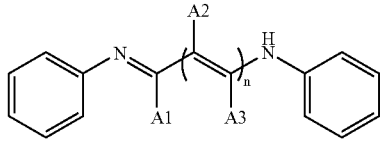

(5)

As hereunder, specific examples of the compound will be listed. Derivatives where n=0 in the formula (2) and Y is an aniline derivative are shown in Table 1 as the formula (6).

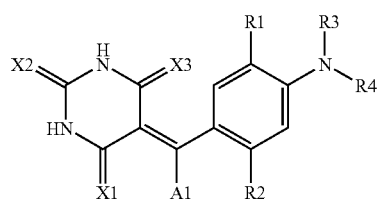

(6)

TABLE 1

| Compound | X1 | X2 | X3 | A1 | R1 | R2 | R3 | R4 |
|---|---|---|---|---|---|---|---|---|
| 1 | O | O | O | H | H | H | $CH_3$ | $CH_3$ |
| 2 | O | O | O | H | H | H | $C_2H_5$ | $C_2H_5$ |
| 3 | O | O | O | H | H | H | $C_4H_9$ | $C_4H_9$ |
| 4 | O | O | O | H | H | H | $C_{12}H_{25}$ | $C_2H_5$ |

TABLE 1-continued

| Compound | X1 | X2 | X3 | A1 | R1 | R2 | R3 | R4 |
|---|---|---|---|---|---|---|---|---|
| 5 | O | O | O | H | H | H | $C_{18}H_{37}$ | $C_{18}H_{37}$ |
| 6 | O | O | O | H | H | H | $C_2H_4OCH_3$ | $C_2H_4OCH_3$ |
| 7 | O | O | O | H | H | H | Phenyl | Phenyl |
| 8 | O | O | O | H | H | H | $C_2H_4COOH$ | $C_2H_4COOH$ |
| 9 | O | O | O | H | H | H | $C_2H_4OH$ | $C_2H_4OH$ |
| 10 | O | O | O | H | H | H | $C_2H_4Br$ | $C_2H_4Br$ |
| 11 | O | O | O | H | H | H | $C_2H_4CN$ | $C_2H_4CN$ |
| 12 | O | O | O | H | H | H | H | H |
| 13 | O | O | O | H | H | H | H | $C_2H_4CO_2C_2H_5$ |
| 14 | O | O | O | H | $OCH_3$ | $CH_3$ | $CH_3$ | $CH_3$ |
| 15 | O | O | O | H | $OCH_3$ | $NHCOCH_3$ | $C_2H_5$ | $C_2H_5$ |
| 16 | O | O | O | H | H | OH | $C_2H_5$ | $C_2H_5$ |
| 17 | O | O | O | H | H | Cl | $CH_3$ | $CH_3$ |
| 18 | O | O | O | H | H | H | tolyl | tolyl |
| 19 | O | S | O | H | H | H | $C_2H_5$ | $C_2H_5$ |
| 20 | S | S | S | H | H | H | $CH_3$ | $CH_3$ |
| 21 | S | O | S | H | H | H | $C_2H_4Cl$ | $C_2H_4CN$ |
| 22 | O | O | O | H | H | H | $C_2H_4$Phenyl | $C_2H_4$Phenyl |
| 23 | O | Se | O | H | H | H | $C_2H_5$ | $C_2H_5$ |
| 24 | O | O | O | H | H | H | $CH_3$ | $C_8H_{17}$ |
| 25 | O | O | O | Cl | H | H | $C_2H_5$ | $C_2H_5$ |
| 26 | O | O | O | Phenyl | H | H | $C_2H_5$ | $C_2H_5$ |
| 27 | O | O | O | $C_2H_5$ | H | H | $C_2H_5$ | $C_2H_5$ |
| 28 | O | O | O | $NHCH_3$ | H | H | $C_2H_5$ | $C_2H_5$ |
| 29 | O | O | O | H | COOH | H | H | H |

Other examples of derivatives of n=0 in the formula (2) are shown below.

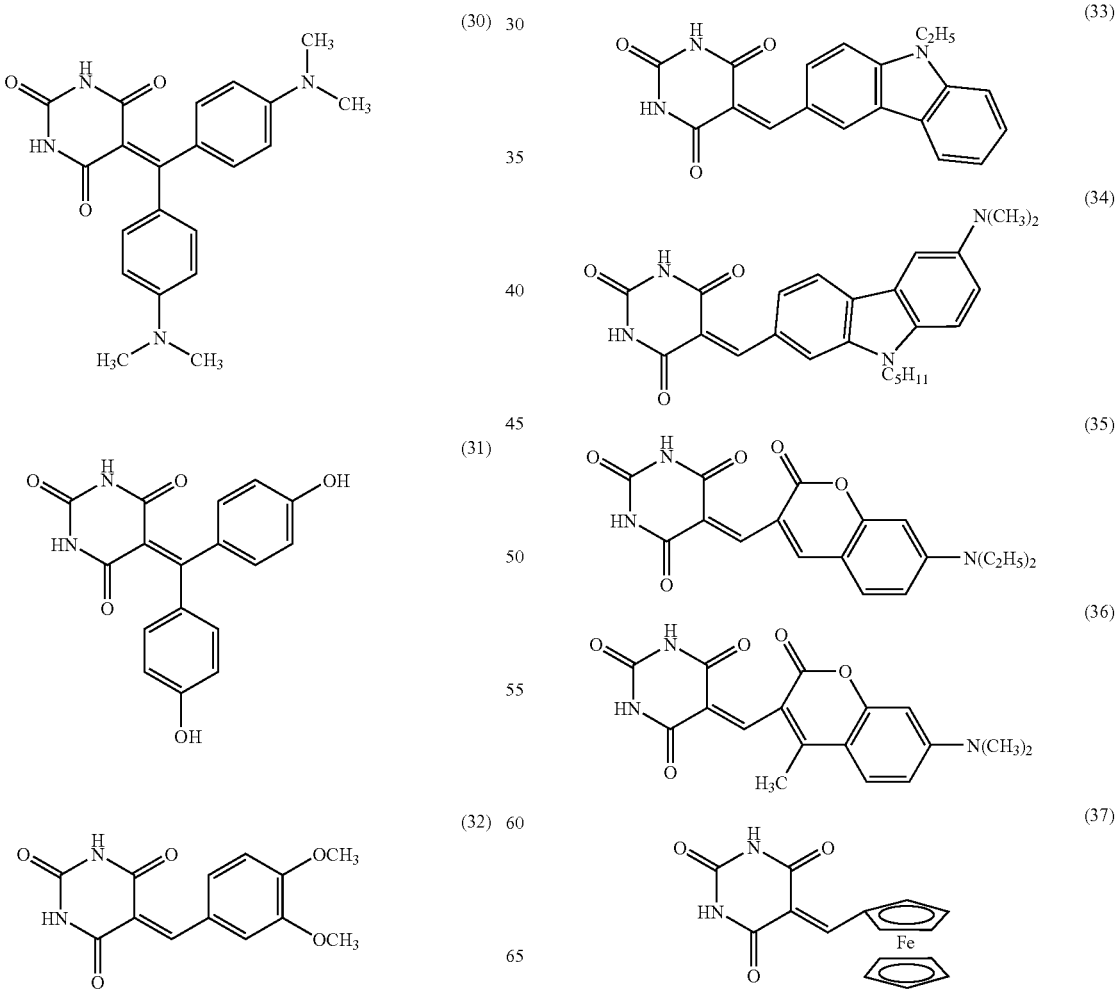

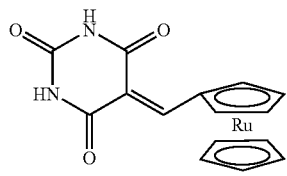

(38)

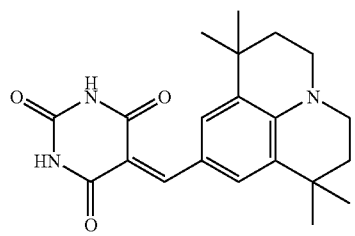

(39)

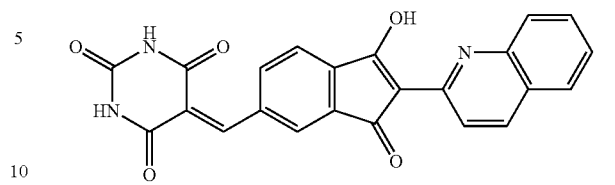

(40)

Examples of the compound where n=1 and Y is an aniline derivative in the formula (2) (the following formula (7)) are shown in Table 2. Further, 4-dimethylaniline and 4-diethylaniline are abbreviated as 4-DMA and 4-DEA, respectively.

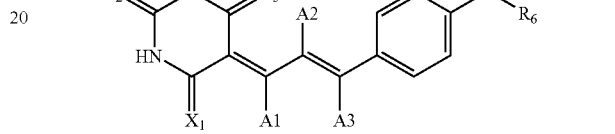

(7)

TABLE 2

| Compound | X1 | X2 | X3 | A1 | A2 | A3 | R5 | R6 |
|---|---|---|---|---|---|---|---|---|
| 41 | O | O | O | H | H | H | $CH_3$ | $CH_3$ |
| 42 | O | O | O | H | H | H | $C_2H_5$ | $C_2H_5$ |
| 43 | O | O | O | H | H | H | $C_4H_9$ | $C_4H_9$ |
| 44 | O | O | O | H | H | H | $C_{12}H_{25}$ | $C_2H_5$ |
| 45 | O | O | O | H | H | H | $C_{18}H_{37}$ | $C_{18}H_{37}$ |
| 46 | O | O | O | H | H | H | $C_2H_4OCH_3$ | $C_2H_4OCH_3$ |
| 47 | O | O | O | H | H | H | Phenyl | Phenyl |
| 48 | O | O | O | H | H | H | $C_2H_4COOH$ | $C_2H_4COOH$ |
| 49 | O | O | O | H | H | H | $C_2H_4OH$ | $C_2H_4OH$ |
| 50 | O | O | O | H | H | H | $C_2H_4Br$ | $C_2H_4Br$ |
| 51 | O | O | O | H | H | H | $C_2H_4CN$ | $C_2H_4CN$ |
| 52 | O | O | O | H | H | H | H | H |
| 53 | O | O | O | H | H | H | H | $C_2H_4CO_2C_2H_5$ |
| 54 | O | O | O | H | H | Cl | $C_2H_5$ | $C_2H_5$ |
| 55 | O | O | O | H | H | $CH_3$ | $C_2H_5$ | $C_2H_5$ |
| 56 | O | O | O | Phenyl | H | H | $C_2H_5$ | $C_2H_5$ |
| 57 | O | O | O | H | $CH_3$ | H | $C_2H_5$ | $C_2H_5$ |
| 58 | O | O | O | H | H | H | tolyl | tolyl |
| 59 | O | S | O | H | H | H | $CH_3$ | $CH_3$ |
| 60 | S | S | S | H | H | H | $CH_3$ | $CH_3$ |
| 61 | S | O | S | H | H | H | $C_2H_4Cl$ | $C_2H_4CN$ |
| 62 | O | O | O | H | H | H | $C_2H_4$Phenyl | $C_2H_4$Phenyl |
| 63 | O | Se | O | H | H | H | $C_2H_5$ | $C_2H_5$ |
| 64 | O | O | O | H | H | H | $CH_3$ | $C_8H_{17}$ |
| 65 | O | O | O | Cl | H | H | $C_2H_5$ | $C_2H_5$ |
| 66 | O | O | O | $NHCH_3$ | H | H | $C_2H_5$ | $C_2H_5$ |
| 67 | O | O | O | $C_2H_5$ | H | H | $C_2H_5$ | $C_2H_5$ |
| 68 | O | O | O | H | H | H | $CH_3$ | $C_2HCl$ |
| 69 | O | O | O | H | H | H | $C_2H_4COCOOCH_3$ | $C_2H_4COCOOCH_3$ |
| 70 | O | O | O | H | H | H | H | $C_2H_4COCOOCH_3$ |

Other examples may be listed as follows.
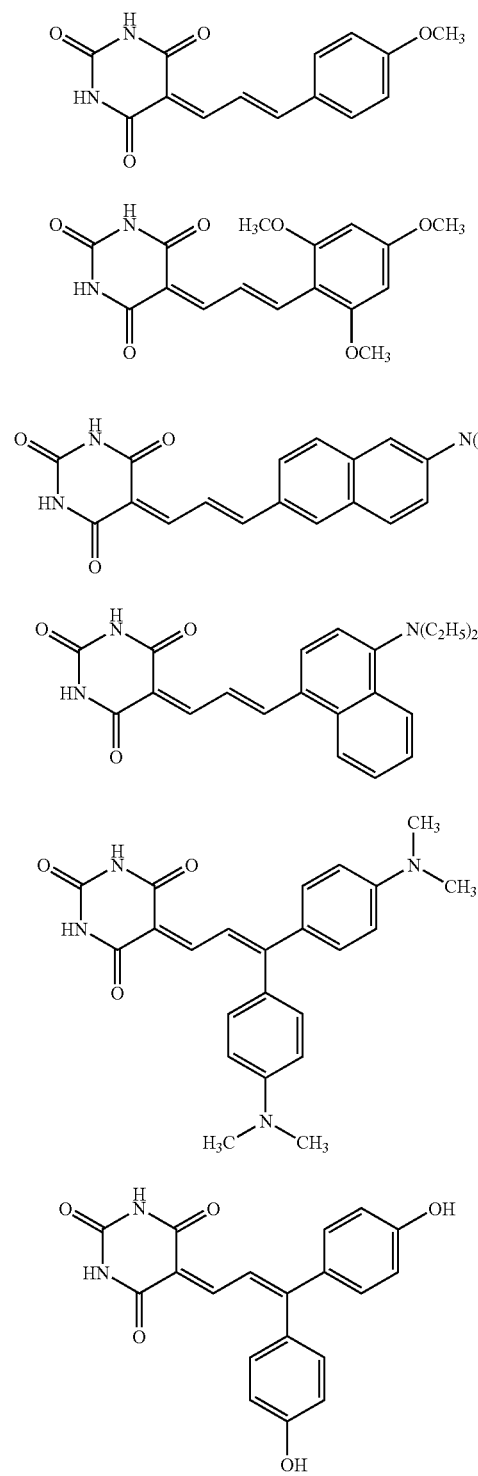
-continued
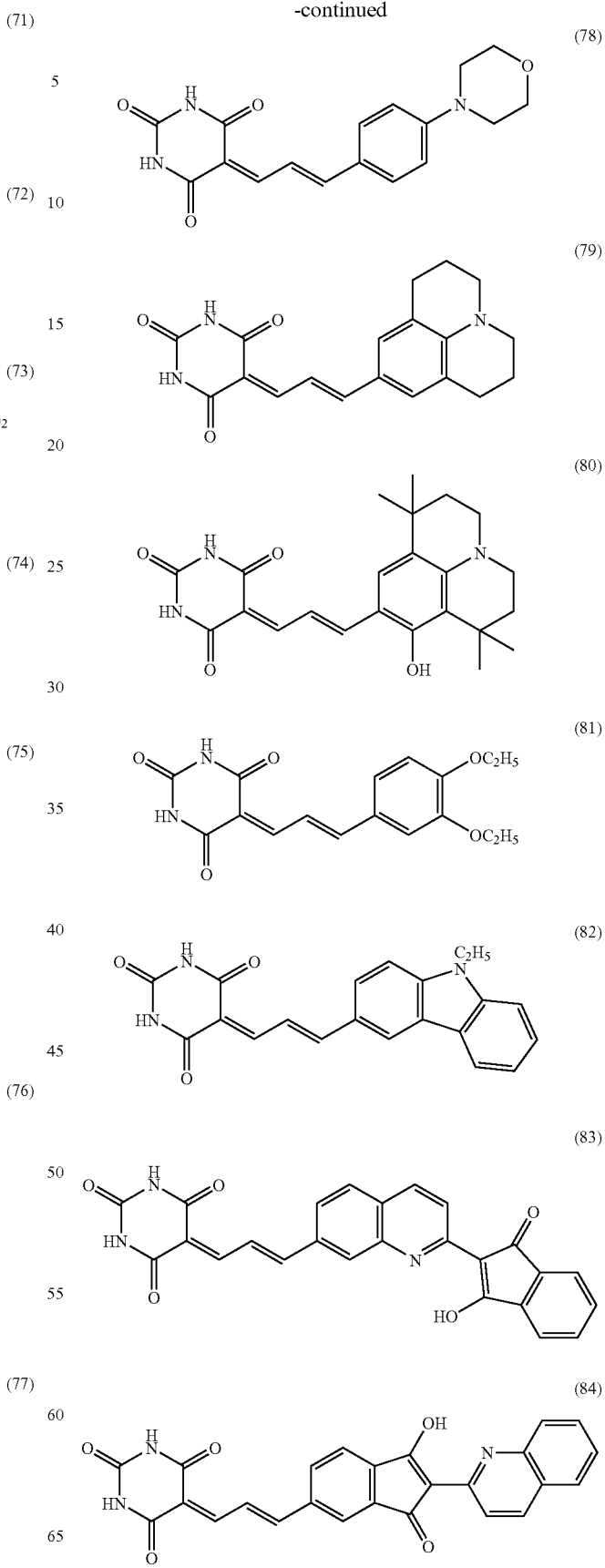

(85) 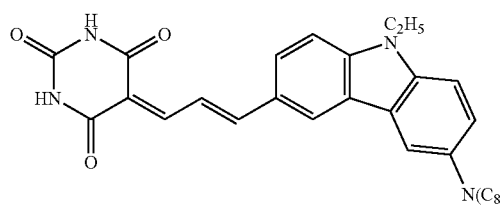
(86) 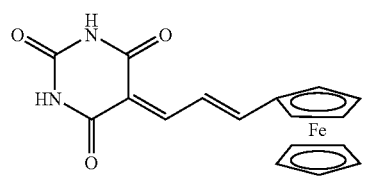
(87) 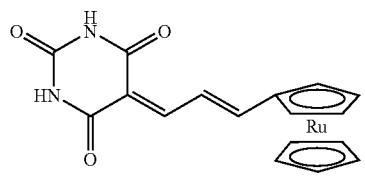
(88) 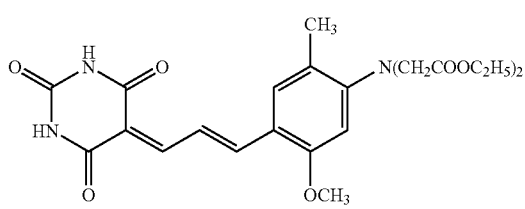
(89) 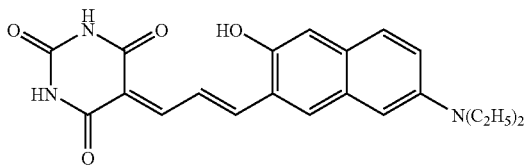
(90) 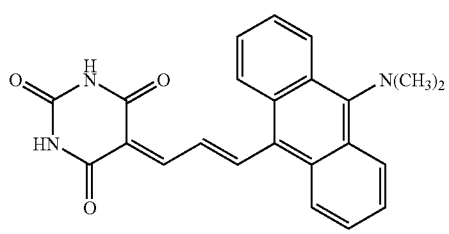
(91) 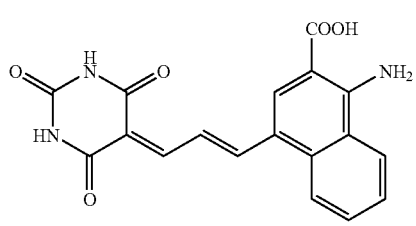
(92) 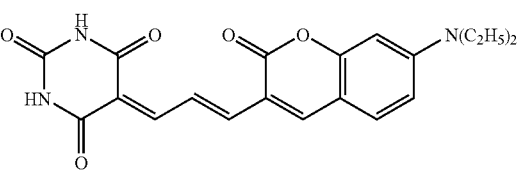
(93) 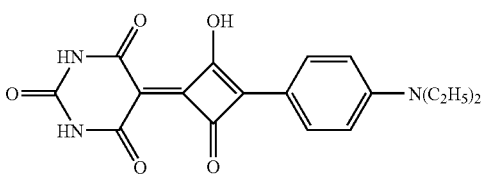
(94) 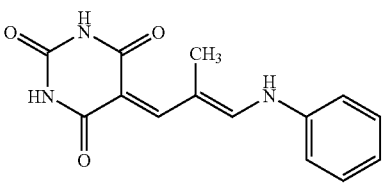
(95) 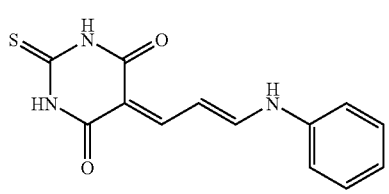
(96) 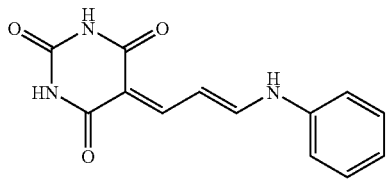
(97) 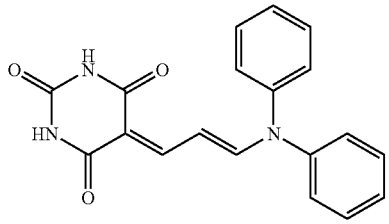
(98) 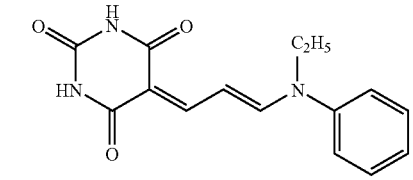
(99) 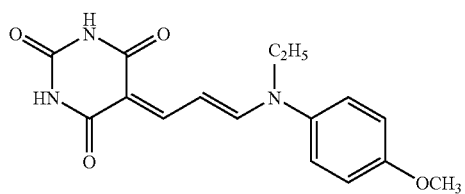

(100)
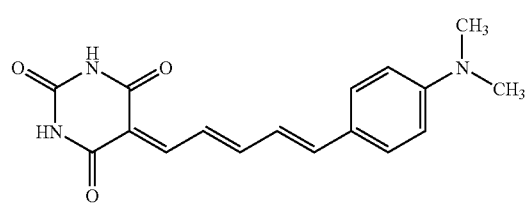
(101)
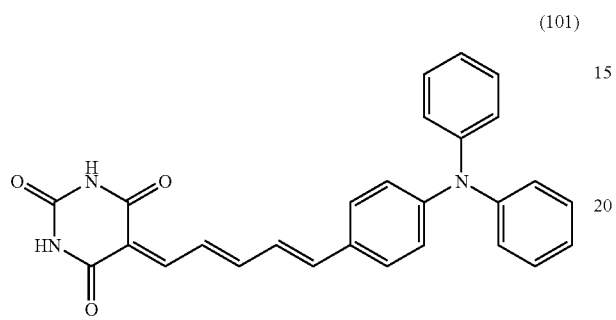
(102)
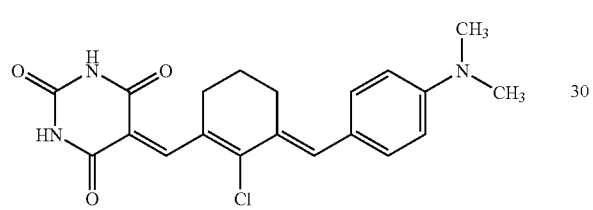
(103)
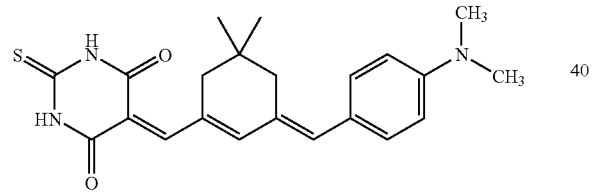
(104)
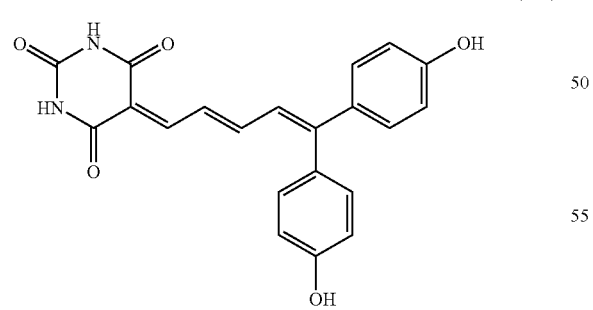
(105)
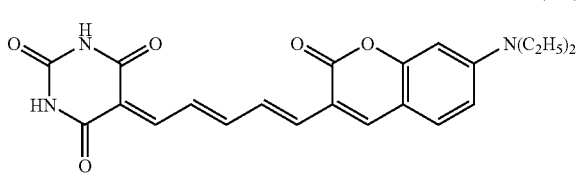
(106)
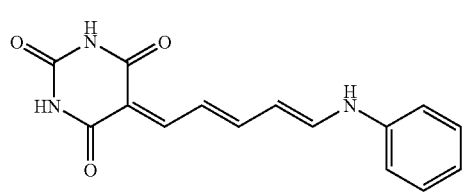
(107)
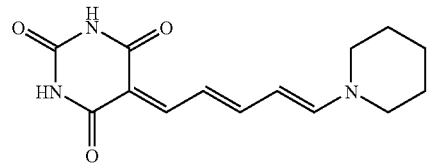
(108)
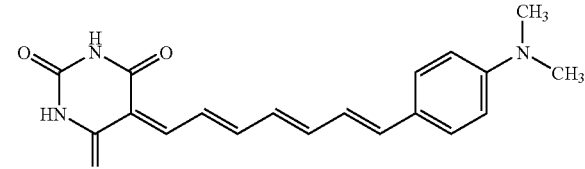
(109)
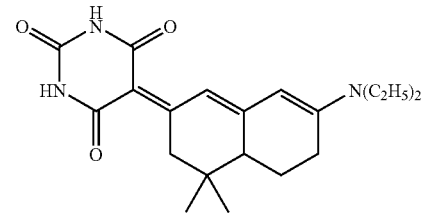
(110)
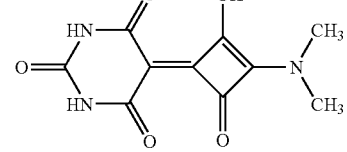
(111)
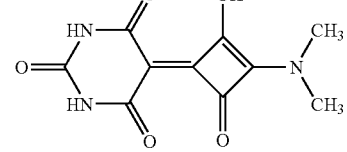
(112)
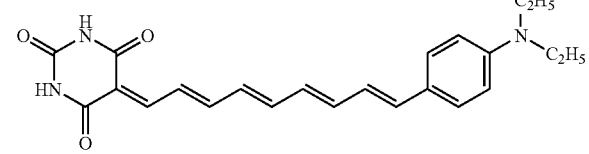

(113)
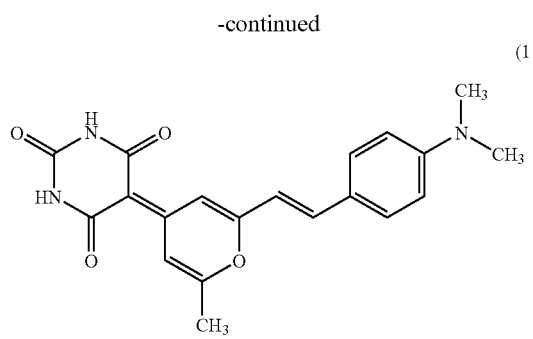
(114)
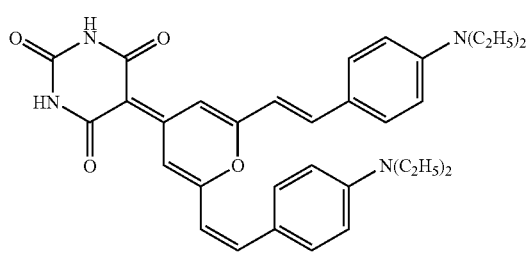
(115)
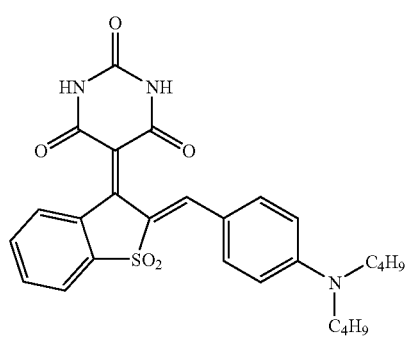
(116)
(117)
(118)
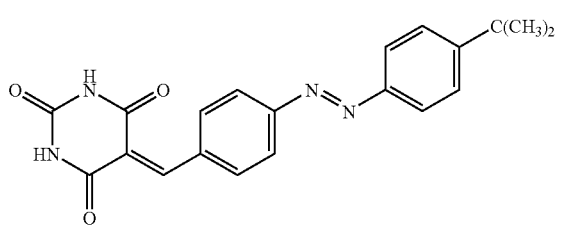
Specific example of the formula(3) are shown below.
(119)
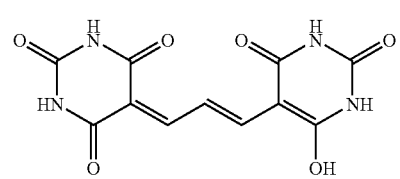
(120)
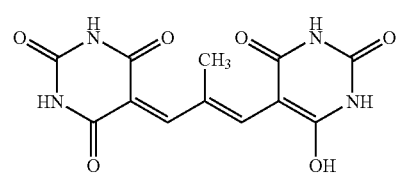
(121)
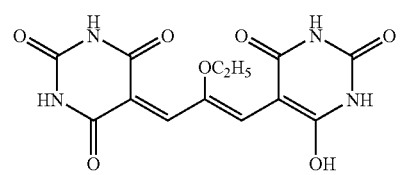
(122)
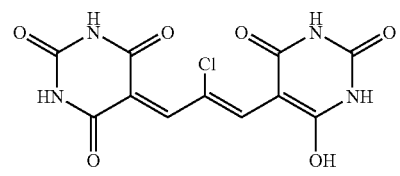
(123)
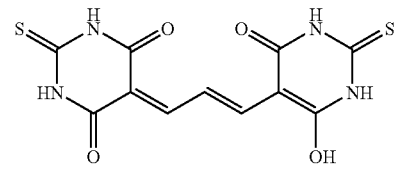
(124)
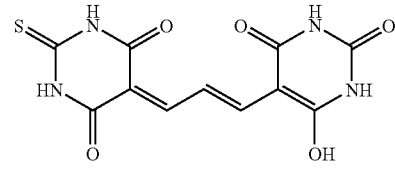
(125)
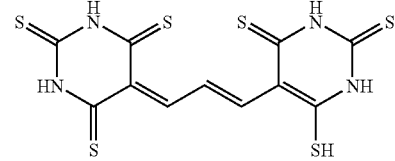

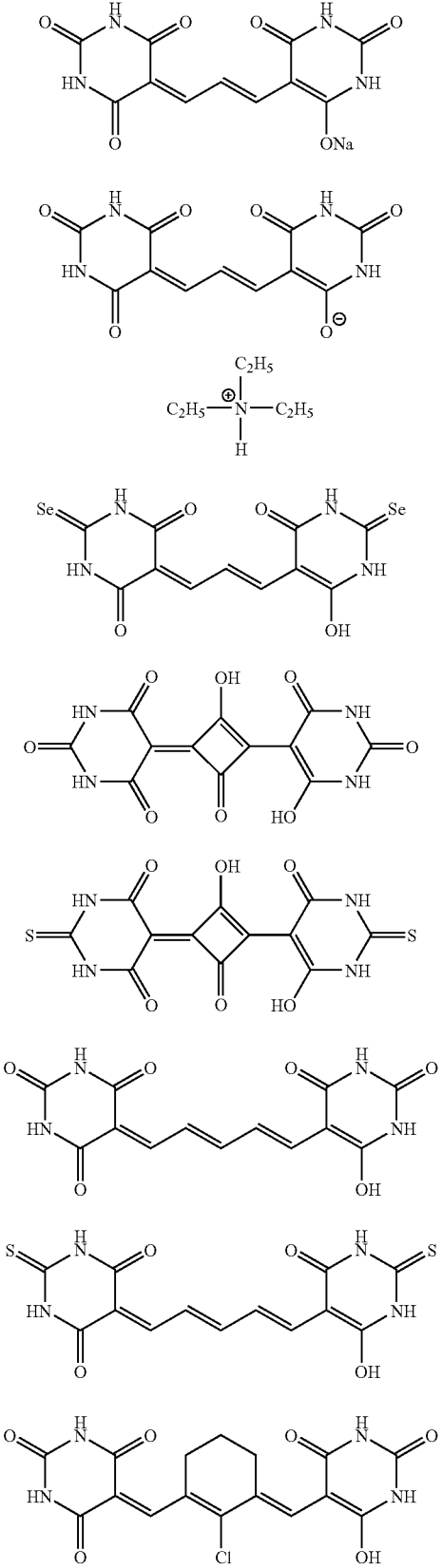
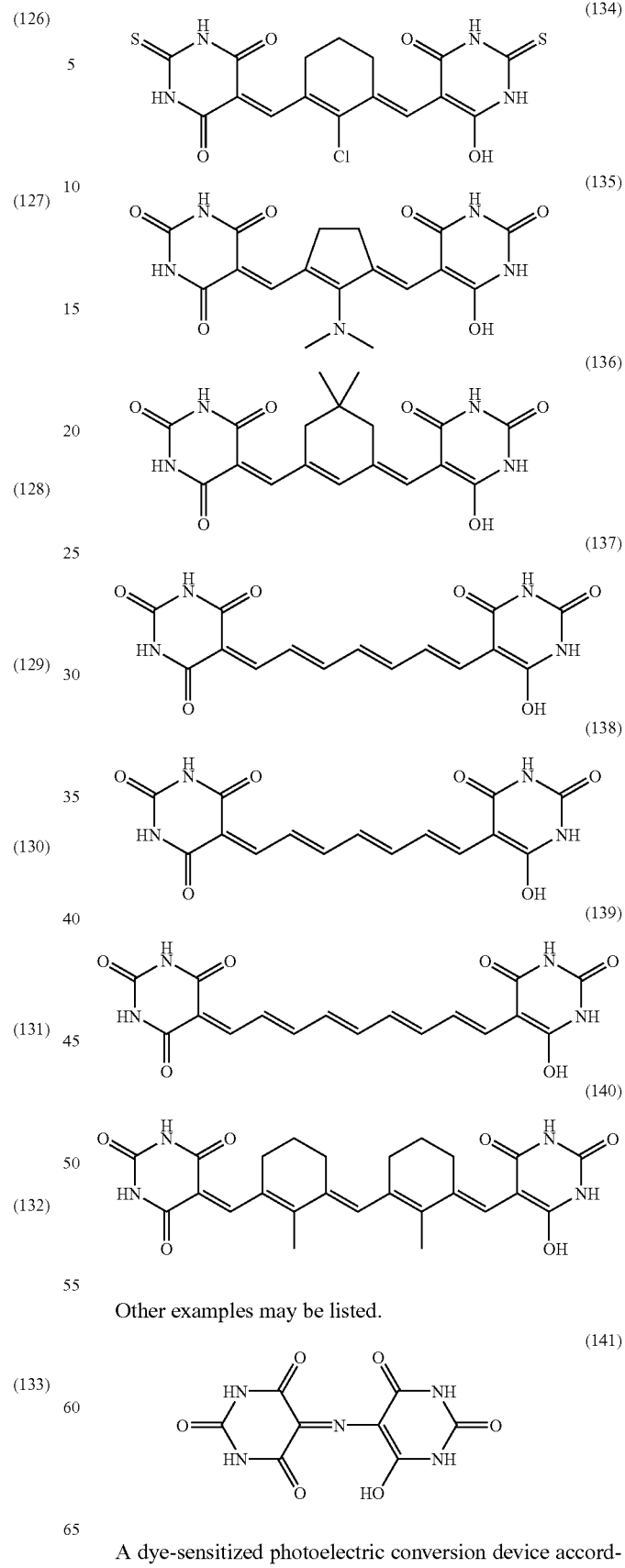
Other examples may be listed.
A dye-sensitized photoelectric conversion device according to the present invention is, for example, a device in which a thin film of an oxide semiconductor is produced on a substrate by using oxide semiconductor fine particles and then a dye is allowed to be adsorbed on the thus-produced thin film.

With regard to a substrate on which the thin film of the oxide semiconductor is formed in the present invention, that where its surface is electrically conductive is preferred and such a substrate is easily available in the market. To be more specific, that where a thin film of electrically conductive metal oxide such as tin oxide being doped with indium, fluorine or antimony or metal such as gold, silver or copper is formed on the surface of glass or on the surface of a transparent polymer material such as polyethylene terephthalate or polyether sulfone may be used. With regard to its conductivity, it is usually sufficient to be 1,000 Ω or less and is preferably to be 100 Ω or less.

As fine particles of the oxide semiconductor, a metal oxide is preferable; specific examples of such metal oxides include oxides of titanium, tin, zinc, tungsten, zirconium, gallium, indium, yttrium, niobium, tantalum, vanadium and the like. Among these oxides, oxides of titanium, tin, zinc, niobium, tungsten and the like are preferable and, above all, titanium oxide is most preferable. These oxide semiconductors can be used either alone or mixture thereof. An average particle diameter of the fine particles of the oxide semiconductor is ordinarily from 1 nm to 500 nm and preferably from 5 nm to 100 nm. These fine particles of the oxide semiconductor can also be used in a state of mixtures of large particle diameter ones and small particle diameter ones.

An oxide semiconductor thin film can be produced by a method in which oxide semiconductor fine particles are directly sprayed on a substrate to form a thin film, a method in which an oxide semiconductor thin film is electrically precipitated by using a substrate as an electrode or a method in which a slurry of semiconductor fine particles to be described below is applied on a substrate, dried and cured or sintered. From the standpoint of performance of an oxide semiconductor electrode, a method which uses the slurry is preferable. In this method, the slurry can be obtained by dispersing the oxide semiconductor fine particles which, are in a secondary agglomeration state by a normal method such that an average primary particle diameter thereof comes to be from 1 nm to 200 nm in a dispersion medium.

Any dispersion medium of the slurry is usable, so long as it is capable of dispersing the semiconductor fine particles. Water or an organic solvent such as an alcohol such as ethanol or the like, a ketone such as acetone, acetylacetone or the like-or a hydrocarbon such as hexane or the like is used and may be used in mixture thereof and, further, it is favorable to use water from a standpoint that it suppresses viscosity changes.

A temperature of sintering a substrate which has been coated with the slurry is ordinarily 300° C. or more, preferably 400° C. or more and a maximum allowable temperature thereof is approximately not greater than a melting point (softening point) of the substrate, ordinarily 900° C. as an upper limit and preferably 600° C. or less. Further, a period of time of sintering the substrate is not particularly limited, but is preferably within about 4 hours. Thickness of the thin film on the substrate is ordinarily from 1 μm to 200 μm and preferably from 5 μm to 50 μm.

The oxide semiconductor thin film may be subjected to a secondary treatment. Namely, for example, the thin film can directly be immersed together with the substrate in a solution of an alkoxide, a chloride, a nitride, a sulfide or the like of the same metal as the semiconductor and, then, dried or sintered again to enhance performance of the semiconductor thin film. Examples of such metal alkoxides include titanium ethoxide, titanium isopropoxide, titanium t-butoxide, n-dibutyl-diacetyl tin and the like and an alcoholic solution thereof is used. Examples of such chlorides include titanium tetrachloride, tin tetrachloride, zinc chloride and the like and an aqueous solution thereof is used.

Next, a method to adsorb a dye on the oxide semiconductor thin film is explained. As the above-described method for adsorbing the dye thereon, mentioned is a method in which a substrate on which the above-described oxide semiconductor thin film has been provided is immersed in a solution obtained by dissolving a dye in a solvent capable of dissolving the dye or in a dispersion liquid obtained by dispersing a dye which has a low solubility. A concentration of the dye in the solution or the dispersion liquid is appropriately determined depending on dyes. The semiconductor thin film formed on the substrate is immersed in the solution. An immersion temperature is approximately from normal temperature up to a boiling point of the solvent and, further, an immersion period of time is from about 1 hour to about 48 hours. Specific examples of solvents to be used in dissolving the dye include methanol, ethanol, acetonitrile, dimethylsulfoxide, dimethylformamide and the like. A concentration of the dye in the solution is ordinarily favorably from $1 \times 10^{-6}$ M to 1 M and preferably from $1 \times 10^{-4}$ M to $1 \times 10^{-1}$ M. In such a way as described above, a photoelectric conversion device of the oxide semiconductor thin film sensitized with the dye can be obtained.

The dye to be adsorbed may be composed of one or a mixture of two or more. When the dyes are mixed, the dyes according to the present invention may be mixed there among or mixed with the other organic dye (including metal complex dyes) which having no partial structure (1). Particularly, by mixing dyes having different absorption wavelengths from one another, a wider absorption wavelength can be utilized and, as a result, a solar cell having high conversion efficiency can be obtained. By utilizing three or more of dyes, it becomes possible to even fabricate an optimum solar cell.

As examples of the metal complex dyes, there is no particular limitation thereon, but a ruthenium complex which have been disclosed in J. Am. Chem. Soc., 115, 6382 (1993) or JP-A-2000-26487, phthalocyanine, porphyrin and the like are preferable. Examples of organic dyes to be utilized for the mixture include dyes such as metal-free phthalocyanine, metal-free porphyrin, or methine-type dyes such as cyanine, merocyanine, oxonol, a triphenyl methane type and the like, a xanthene type, an azo type, an anthraquinone type and the like. Among these dyes, the ruthenium complex and methine-type dyes such as merocyanine and the like are preferable. A ratio of the dyes to be mixed is not particularly limited and is optimized according to respective dyes. However, it is ordinarily preferable to mix them in the range of between each equivalent mol and about 10% mol or more for a dye. When mixed dyes are adsorbed on the thin film of the oxide semiconductor fine particles by using a solution in which such mixed dyes are mix-dissolved or dispersed, a concentration of entire dyes in the solution may be same as that in a case in which only one type of dye is adsorbed.

When the dye is adsorbed on the thin film of the oxide Semiconductor fine particles, it is effective to adsorb the the dye in the presence of an inclusion compound in order to prevent dyes from associating with each other. Examples of such inclusion compounds include steroid-type compounds such as cholic acid and the like, crown ethers, cyclodextrin, calixarene, polyethylene oxide and the like. Cholic acid, polyethylene oxide and the like are preferable. Further, after the dye is adsorbed thereon, a surface of a semiconductor electrode may be treated with an amine compound such as 4-t-butylpyridine or the like. As a method for such treatment, for example, a method in which a substrate having a thin film, on which the dye is adsorbed, of the semiconductor fine particles is immersed in an ethanol solution of an amine or the like can be adopted.

The solar cell according to the present invention comprises a photoelectric conversion device electrode in which the dye is adsorbed on the above-described oxide semiconductor thin film, a counter electrode and a redox electrolyte or a hole transfer material. The redox electrolyte may be a solution in which a redox pair is dissolved in a solvent, a gel electrolyte that a polymer matrix is impreganated with a redox pair or a solid electrolyte such as a fused salt. Examples of nole transfer materials include an amine derivative, an electrically conductive polymer such as polyacetylene, polyaniline, polythiophene or the like, a material using a discotic liquid crystal phase such as polyphenylene and the like. The counter electrode to be used is preferably an electrode which has electric conductivity and catalytically acts on a reduction reaction of the redox electrolyte. For example, a material in which platinum, carbon, rhodium, ruthenium or the like is vapor-deposited on glass or a polymer film, or electrically conductive fine particles are applied thereon can be used.

Examples of redox electrolytes to be used in solar cells according to the present invention include a halogen redox electrolyte comprising a halogen compound and halogen molecule having a halogen ion as a counter ion, a metal oxidation-reduction type electrolyte of a metal complex or the like such as ferrocyanate-ferricyanate, ferrocene-ferricinium ion or the like and an aromatic redox electrolyte such as alkylthiol-alkyldisulfide, a viologen dye, hydroquinone-quinone or the like, and the halogen redox electrolyte is preferable. As the halogen molecule in the halogen redox electrolyte comprising halogen compound halogen molecule, mentioned is, for example, an iodine molecule, a bromine molecule or the like, and the iodine molecule is preferable. Further, examples of the halogen compounds having a halogen ion as a counter ion include a halogenated metal salt, for example, LiI, NaI, KI, CsI, $CaI_2$ or the like, or an organic quaternary ammonium salt of halogen such as tetraalkylammonium iodide, imidazolium iodide, pyridinium iodide or the like, and a salt-type compound having the iodine ion as a counter ion is preferable. Examples of such salt-type compounds having the iodine ion as a counter ion include lithium iodide, sodium iodide, a trimethyl iodide ammonium salt and the like.

Further, when the redox electrolyte is constituted in a solution state containing itself, an electrochemically inert solvent is used as a solvent. Examples of such solvents include acetonitrile, propylene carbonate, ethylene carbonate, 3-methoxypropionitrile, methoxyacetonitrile, ethylene glycol, propylene glycol, diethylene glycol, triethylene glycol, γ-butyrolactone, dimethoxyethane, diethyl carbonate, diethyl ether, diethyl carbonate, dimethyl carbonate, 1,2-dimethoxyethane, dimethyl formamide, dimethyl sulfoxide, 1,3-dioxolane, methyl formate, 2-methyl tetrahydrofuran, 3-methoxy-oxaziridine-2-one, sulfolane, tetrahydrofuran, water and the like. Among these solvents, particularly, acetonitrile, propylene carbonate, ethylene carbonate, 3-methoxypropionitrile, methoxyacetonitrile, ethylene glycol, 3-methoxyoxaziridine-2-one and the like are preferable. These solvents may be used either alone or in any combination of two or more. In a case of the gel electrolyte, mentioned is a gel electrolyte which uses a polyacrylate or polymethacrylate resin or the like as a matrix. A concentration of the redoxelectrolyte is ordinarily from 0.01% by weight to 99% by weight and preferably from about 0.1% by weight to about 90% by weight.

The solar cell according to the present invention can be obtained by arranging the counter electrode against an electrode of the photoelectric conversion device adsorbing the dye in the oxide semiconductor thin film on the substrate such that the electrode of the photoelectric conversion device is interposed, and filling a solution containing the redox electrolyte between the electrode of the photoelectric conversion device and the counter electrode.

EXAMPLES

The present invention is now more specifically described with reference to Examples. However, it should be noted that these Examples should not be interpreted as limiting the present invention. Unless stated otherwise, all parts and percentages in these Examples are given by mass.

Synthetic Example 1

Barbituric acid (1 part) and 1.5 parts of 4-diethylaminobenzaldehyde were dissolved in 10 parts of ethanol and 0.3 part of piperazine anhydride was dropped thereinto. After the reaction was carried out under refluxing for 2 hours, the solid obtained by cooling was filtered, washed, dried, then recrystallized from ethanol, filtered, washed and dried to give 1.9 parts of the compound (2).

Absorption maximum (methanol): 467 nm

Synthetic Example 2

Barbituric acid (1 part) and 2 parts of 4-diphenylaminobenzaldehyde were dissolved in 10 parts of ethanol and 0.3 part of piperazine anhydride was dropped thereinto. After the reaction was carried out under refluxing for 2 hours, the solid obtained by cooling was filtered, washed, dried, then recrystallized from ethanol, filtered, washed and dried to give 1.8 parts of the compound (7).

Absorption maximum (ethanol): 464 nm

Synthetic Example 3

Barbituric acid (1 part) and 2 parts of 4-diphenylaminocinnamaldehyde were dissolved in 10 parts of ethanol and 0.3 part of piperazine anhydride was dropped thereinto. After the reaction was carried out under refluxing for 2 hours, the solid obtained by cooling was filtered, washed, dried, then recrystallized from ethanol, filtered, washed and dried to give 1.8 parts of the compound (47).

Absorption maximum (ethanol): 514 nm

Synthetic Example 4

Thiobarbituric acid (1 part) and 2 parts of 4-dimethylaminocinnamaldehyde were dissolved in 10 parts of ethanol and 0.3 part of piperazine anhydride was dropped thereinto. After the reaction was carried out under refluxing for 2 hours, the solid obtained by cooling was filtered, washed, dried, then recrystallized from ethanol, filtered, washed and dried to give 2.0 parts of the compound (59).

Absorption maximum (ethanol): 530 nm

Synthetic Example 5

Barbituric acid (1 part) and 1 part of malonaldehyde dianilide hydrochloride were added to 10 parts of ethanol and 0.1 part of piperazine anhydride was dropped thereinto. After the reaction was carried out under refluxing for 2 hours, the solid obtained by cooling was filtered, washed, dried, then repeatedly reprecipitated and recrystallized from ethanol or the like and filtered, washed and dried to give 0.4 part of the compound (96).

Absorption maximum (ethanol): 441 nm

Synthetic Example 6

Barbituric acid (1 part) and 1 part of glutaconaldehyde dianil hydrochloride were added to 10 parts of ethanol and 0.1 part of piperazine anhydride was dropped thereinto. After the reaction was carried out under refluxing for 2 hours, the solid obtained by cooling was filtered, washed, dried, then repeatedly reprecipitated and recrystallized from ethanol or the like and filtered, washed and dried to give 0.3 part of the compound (106).

Absorption maximum (ethanol): 538 nm

Synthetic Example 7

Barbituric acid (15 parts), 13 parts of malonaldehyde dianilide hydrochloride, 100 parts of DMF and 1 part of piperazine were heated to react at 100-120° C. for 3 hours and the solid obtained by cooling was subjected to repeated filtration, washing and reprecipitation and dried to give 10 parts of the compound (119).

Absorption maximum (DMF): 489 nm

Synthetic Example 8

Barbituric acid (16 parts), 14 parts of glutaconaldehyde dianil hydrochloride, 100 parts of DMF and 1 part of piperazine were heated to react at 100-120° C. for 3 hours and the solid obtained by cooling was subjected to repeated filtration, washing and reprecipitation and dried to give 11 parts of the compound (131).

Absorption maximum (methanol): 585 nm

Examples

Dye(s) was/were dissolved in ethanol to make the concentration $3.2 \times 10^{-4}$ M. A porous substrate (semiconductor thin film electrode where porous titanium oxide was burned at 450° C. for 30 minutes on a transparent electrically conductive glass electrode) was dipped in the solution at room temperature from 3 hours to one night so that the dye(s) was/were adsorbed therewith, washed with a solvent and dried to give a photoelectric conversion device of semiconductor thin film sensitized with the dye(s).

For Examples 1, 7, 8, 9 and 14, one kind of dye as shown in Table 3 was used and adjusted to give the above-mentioned concentration whereupon a photoelectric conversion device adsorbing the one kind of dye was obtained by the above method.

For Examples 16, 17, 18 and 19, a solution was prepared where concentration of each of two kinds of dye (s) was made $1.6 \times 10^{-4}$ M whereupon a photoelectric conversion device adsorbing the two kinds of dye(s) was obtained by the above method.

In Examples 2, 3, 4, 5, 6, 10, 11 and 13, a kind of dye as shown in Table 3 was used and adjusted to give the above-mentioned concentration. Using the above-mentioned porous substrate, a 0.2 M aqueous solution of titanium tetrachloride was dropped onto an area of thin film of titanium oxide of the semiconductor thin film electrode, allowed to stand at room temperature for 24 hours, washed with water and burned at 450° C. again for 30 minutes to give a semiconductor thin film electrode treated with titanium tetrachloride. The dye was adsorbed therewith by the same manner as above using the resulting semiconductor thin film electrode.

For Example 15, one kind of dye as shown in Table 3 was used and cholic acid was added as an inclusion compound to make its concentration $3 \times 10^{-2}$ M during adsorption of the dye whereupon a solution of the above-mentioned dye was prepared and then it was adsorbed with the semiconductor thin film to give a dye-sensitizing semiconductor thin film which was treated with cholic acid.

Measurement of short-circuit current, open circuit voltage and conversion efficiency was carried out as follows.

Thus, electrically conductive glass sheets where the surface was sputtered with platinum were fixed so that the above-prepared dye(s) sensitizing semiconductor thin film is interposed and a solution containing an electrolyte was poured into the gap. With regard to the electrolyte solution, that where iodine/tetra-n-propylammonium iodide was dissolved in a 6:4 solution of ethylene carbonate and acetonitrile at the concentration of 0.02 M/0.5 M was used except Example 18.

In Example 18, the electrolyte was that where iodine/lithium iodide/1,2-dimethyl-3-n-propylimidazolium iodide/tert-butylpyridine was dissolved in 3-methoxypropionitrile at the concentration of 0.1M/0.1M/0.6M/1M each.

With regard to the size of the battery to be measured, the running part was made 0.25 cm$^2$. With regard to a source of light, a 500-watt xenon lamp was used and made 100 mW/cm$^2$ by passing through an AM 1.5 filter. Short-circuit current, open circuit voltage and conversion efficiency were measured using a potentio-galvanostat.

Comparative Examples

In Comparative Examples 1 and 2, the following Ru complex dye(s) (142) and merocyanine dye(s) (143) were used, respectively by the same manner as in the above Example 1 whereupon photoelectric conversion devices were prepared.

With regard to the measurement of short-circuit current, open circuit voltage and conversion efficiency, it was carried out by the same manner as in Example 18 for Comparative Example 1 while, for Comparative Example 2, it was carried out by the same manner as in Example 1.

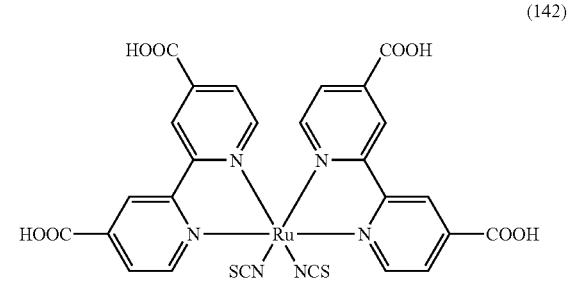

(142)

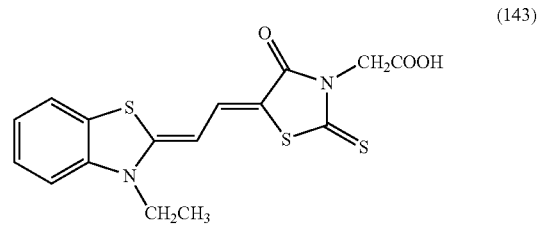

(143)

TABLE 3

| Example | Organic Dye | Short circuit current (mA/cm$^2$) | Open circuit voltage (V) | Conversion efficiency (%) | TiCl4 treatment of thin film | Cholicacid treatment |
| --- | --- | --- | --- | --- | --- | --- |
| 1 | 2 | 4.8 | 0.61 | 2.0 | Untreated | Untreated |
| 2 | 7 | 7.1 | 0.52 | 2.1 | Treated | Untreated |
| 3 | 41 | 1.4 | 0.60 | 0.6 | Treated | Untreated |
| 4 | 47 | 6.6 | 0.46 | 1.5 | Treated | Untreated |
| 5 | 59 | 1.5 | 0.58 | 0.6 | Treated | Untreated |
| 6 | 95 | 3.1 | 0.58 | 1.2 | Treated | Untreated |
| 7 | 96 | 2.8 | 0.63 | 1.2 | Untreated | Untreated |
| 8 | 106 | 8.3 | 0.53 | 2.3 | Untreated | Untreated |
| 9 | 107 | 3.2 | 0.49 | 1.0 | Untreated | Untreated |
| 10 | 107 | 5.1 | 0.45 | 1.2 | Treated | Untreated |
| 11 | 141 | 0.6 | 0.35 | 0.11 | Treated | Untreated |
| 12 | 119 | 6.7 | 0.57 | 2.2 | Untreated | Untreated |
| 13 | 119 | 7.5 | 0.57 | 2.4 | Treated | Untreated |
| 14 | 131 | 8.4 | 0.44 | 1.8 | Untreated | Untreated |
| 15 | 131 | 5.7 | 0.55 | 1.9 | Untreated | Treated |
| 16 | 96 + 119 | 6.4 | 0.67 | 2.7 | Untreated | Untreated |
| 17 | 119 + 131 | 7.4 | 0.58 | 2.7 | Untreated | Untreated |
| 18 | 96 + 142 | 11.5 | 0.69 | 4.8 | Untreated | Untreated |
| 19 | 106 + 143 | 9.5 | 0.59 | 2.6 | Untreated | Untreated |
| Comparative Example | | | | | | |
| 1 | 142 | 11.0 | 0.71 | 4.5 | Untreated | Untreated |
| 2 | 143 | 6.3 | 0.56 | 2.4 | Untreated | Untreated |

INDUSTRIAL APPLICABILITY

In the dye(s) sensitizing photoelectric conversion device according to the present invention, a dye having a barbituric acid moiety was used whereby a solar battery having a high conversion efficiency was able to be provided.

The invention claimed is:

1. A photoelectric conversion device comprising oxide semiconductor fine particles sensitized with a compound represented by the following formula (2)

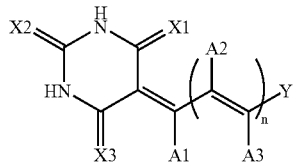

(2)

{wherein A1, A2 and A3 each independently is an unsubstituted or substituted aromatic hydrocarbon residue, an unsubstituted or substituted amino group, hydroxyl group, hydrogen atom, halogen atom or cyano group; X1, X2 and X3 each independently is oxygen atom or sulfur atom, selenium atom; Y is a mono- or di-substituted aminophenyl group where the amino group is substituted with a phenyl group or an unsubstituted C1 to C20 alkyl group; or a mono- or di-substituted amino group where one of the substituents is a phenyl group and in the case where the amino group is di-substituted, the other substituent is an alkyl group or a phenyl group, or a piperidino group; n is an integer of zero or 1 to 2; when n is 2 whereby a plurality of A2 and A3 are present, each of A2 and each of A3 may be same or different and each shows the above-mentioned groups; and A1, A2 (including the case where a plurality thereof are present) and A3 (including the case where a plurality thereof are present) may form a ring being bonded by a plurality of groups therein and the ring formed as such may be substituted}.

2. The photoelectric conversion device according to claim 1, wherein the fine particles of the oxide semiconductor contain titanium dioxide as an essential component.

3. A photoelectric conversion device which is characterized in using an oxide semiconductor sensitized by the joint use of two or more members selected from the compound of the following formula (2)

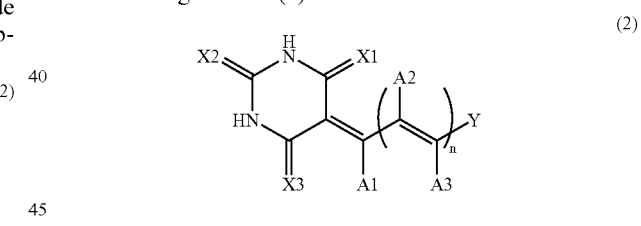

(2)

{wherein A1, A2 and A3 each independently is an unsubstituted or substituted aromatic hydrocarbon residue, an unsubstituted or substituted amino group, hydroxyl group, hydrogen atom, halogen atom or cyano group; X1, X2 and X3 each independently is oxygen atom or sulfur atom, selenium atom; Y is a mono- or di-substituted aminophenyl group where the amino group is substituted with a phenyl group or an unsubstituted C1 to C20 alkyl group; a mono- or di-substituted amino group where one of the substituents is a phenyl group and in the case where the amino group is di-substituted, the other substituent is an alkyl group or phenyl group, or piperidino group; n is an integer of zero or 1 to 2; when n is 2 whereby a plurality of A2 and A3 are present, each of A2 and each of A3 may be same or different and each shows the above-mentioned groups; and A1, A2 (including the case where a plurality thereof are present) and A3 (including the case where a plurality thereof are present) may form a ring being bonded by a plurality of groups therein and the ring formed as such may be substituted and organic dye (including metal complex) having no structure of the above formula (2)

(excluding the case of joint use of organic dye(s) (including metal complexes) having no structure of the above formula (2))}.

4. The photoelectric conversion device according to claim 1, 3 or 2, wherein dye(s) is adsorbed to the fine particles of oxide semiconductor in the presence of an inclusion compound.

5. A solar cell which is characterized in using the photoelectric conversion device mentioned in claim 1, 3 or 2.

6. A photoelectric conversion device according to claim 1 or 3, wherein Y is a diphenylaminophenyl group, a monophenylaminophenyl group, or a piperidino group.

7. A photoelectric conversion device, comprising oxide semiconductor fine particles sensitized with a compound represented by the following formula (2)

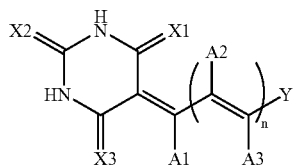

(2)

(wherein X1, X2 and X3 are oxygen atoms; n is zero or 1 to 2; A1, A2 and A3 are hydrogen atoms; and Y is mono- or di-substituted aminophenyl group which is substituted with unsubstituted C1 to C20 alkyl groups or phenyl groups; or mono- or di-substituted amino group which is substituted with phenyl groups; or a piperidino group).

8. A photoelectric conversion device according to claim 1 or 7, wherein X1, X2 and X3 are oxygen atoms; n is zero; A1 is a hydrogen atom; and Y is N,N-diethylaminophenyl.

9. The photoelectric conversion device according to claim 1, 3 or 7, wherein said unsubstituted C1 to C20 alkyl group is an unsubstituted C1 to C4 alkyl group.

10. Fine particles of oxide semiconductor which is sensitized by the compound of the following formula (2)

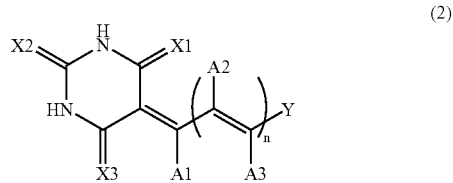

(2)

{wherein A1, A2 and A3 each independently is an unsubstituted or substituted aromatic hydrocarbon residue, an unsubstituted or substituted amino group, hydroxyl group, hydrogen atom, halogen atom or cyano group; X1, X2 and X3 each independently is oxygen atom or sulfur atom, selenium atom; Y is a mono- or di-substituted aminophenyl group where the amino group is substituted with a phenyl group or an unsubstituted C1 to C20 alkyl group; a mono- or di-substituted amino group where one of the substituents is a phenyl group and in the case where the amino group is di-substituted, the other substituent is an alkyl group or phenyl group, or a piperidino group; n is an integer of zero or 1 to 2; when n is 2 whereby a plurality of A2 and A3 are present, each of A2 and each of A3 may be same or different and each shows the above-mentioned groups; and A1, A2 (including the case where a plurality thereof are present) and A3 (including the case where a plurality thereof are present) may form a ring being bonded by a plurality of groups therein and the ring formed as such may be substituted}.

* * * * *